United States Patent
Bacchi et al.

[11] Patent Number: 5,852,413
[45] Date of Patent: Dec. 22, 1998

[54] VIRTUAL ABSOLUTE POSITION ENCODER

[75] Inventors: Paul Bacchi, Novato; Paul S. Filipski, Greenbrae, both of Calif.

[73] Assignee: Kensington Laboratories, Inc., Richmond, Calif.

[21] Appl. No.: 927,837

[22] Filed: Sep. 11, 1997

Related U.S. Application Data

[63] Continuation of Ser. No. 542,833, Oct. 13, 1995, abandoned.

[51] Int. Cl.[6] ........................................... H03M 1/30
[52] U.S. Cl. .......................... 341/13; 341/9; 250/231.18
[58] Field of Search ............................. 341/3, 9, 11, 13; 250/231.13, 231.14, 231.18

[56] References Cited

U.S. PATENT DOCUMENTS

| | | | |
|---|---|---|---|
| 4,074,258 | 2/1978 | Dore et al. | 341/13 |
| 4,572,952 | 2/1986 | March | 250/231.13 |
| 4,602,242 | 7/1986 | Kimura | 341/13 |
| 4,631,519 | 12/1986 | Johnston | 341/13 |
| 4,736,187 | 4/1988 | Kibrick | 340/347 P |
| 4,901,073 | 2/1990 | Kibrick | 341/13 |
| 4,970,387 | 11/1990 | Kubo et al. | 250/231.14 |
| 5,064,340 | 11/1991 | Genov et al. | 414/744.5 |
| 5,102,280 | 4/1992 | Poduje et al. | 414/225 |
| 5,252,825 | 10/1993 | Imai et al. | 250/231.18 |
| 5,260,568 | 11/1993 | Ieki | 250/231.18 |
| 5,308,222 | 5/1994 | Bacchi et al. | 414/783 |
| 5,332,895 | 7/1994 | Rieder et al. | 250/231.14 |
| 5,382,806 | 1/1995 | Bacchi et al. | 250/561 |
| 5,438,330 | 8/1995 | Yamazaki et al. | 341/11 |

*Primary Examiner*—Marc S. Hoff
*Attorney, Agent, or Firm*—Stoel Rives LLP

[57] ABSTRACT

A rotary stage (26) is positionable in precise angular increments that are determined by a virtual absolute position encoder disk (106). The angular increments are determined to a 2,400 arc-second absolute resolution by a bar code scale (110) and to a 0.125 arc-second relative resolution by interpolating interference patterns generated by a diffraction grating-based incremental encoder scale (108). The position encoder may be considered a virtual absolute encoder because as little as 0.66 degrees of rotation is required to know the absolute angular position of the rotary stage. The bar code scale eliminates the need for stop bits and quiet zones, which results in increased bar code resolution. The preferred bar code format includes a continuously abutting series of 15-bar slot position bar code patterns positioned as a single track encircling the encoder disk. The first four bar slots of each pattern contain a fixed start code (132), and the remaining 11 bits contain a unique sector-identifying code (134) that does not match the start code.

14 Claims, 5 Drawing Sheets

VIRTUAL ABSOLUTE POSITION ENCODER

This is a continuation of application Ser. No. 08/542,833, filed Oct. 13, 1995, now abandoned.

TECHNICAL FIELD

This invention relates to position encoders and, in particular, to a virtual absolute position encoder that combines an angular position encoder employing bar codes that provide multiple absolute positioning indicia with an incremental encoder that provides accurate relative positioning indicia.

BACKGROUND OF THE INVENTION

There are a wide variety of article positioning applications that employ encoders to determine the absolute and relative positions of mechanisms and articles being manipulated for purposes such as processing, inspection, testing, aiming, data acquisition, conveying, storage, marking, and scanning. Indeed, position encoders are employed in aiming astronomical telescopes at particular stars as well as positioning specimens under microscopes for inspection. While the position encoding principles employed by these diverse applications are similar, the differences of scale pose widely different positioning problems that each require different solutions.

In a large-scale positioning example, aiming a telescope and moving its associated dome is a slow process that requires accurate absolute encoding of angular positions. U.S. Pat. No. 4,901,073 for ENCODER FOR MEASURING THE ABSOLUTE POSITION OF MOVING ELEMENTS describes the use of the telescope dome as a component of an absolute angular encoder. A band of material is marked with multiple bar code patterns and attached to an inner surface of the rotating dome. The bar code patterns comprise a series of discrete bar code symbols, with each symbol encoding an absolute angular position of the dome. As the dome rotates, the bar code symbols move past a bar code scanner that scans whichever bar code symbol is currently positioned in front of it and produces an electrical signal corresponding to the bar code symbol being scanned. A bar code decoder then decodes the signal from the bar code scanner into the corresponding absolute position of the dome. Because bar code symbols typically include bit and character checking, their use in position encoding applications can provide error detection capability not found in other types of incremental or absolute encoders.

However, a disadvantage of the above-described position encoder is that conventional bar code scanning requires framing each bar code with a "quiet zone" and start and stop bits that limit the number of bar codes that can be spaced along a given encoder length. Even with a very large encoder length, such as an inside periphery of the telescope dome, only about 3,600 bar code symbols can be spaced around the periphery, yielding a 0.1-degree absolute encoding accuracy and resolution.

Small-scale positioning examples are set forth in U.S. Pat. No. 5,102,280 for ROBOT PREALIGNER and U.S. Pat. No. 5,064,340 for PRECISION ARM MECHANISM, both of which describe mechanisms for accurately converting rotary motive power unto linear positioning motion. Such mechanisms are commonly employed in specimen handlers and are useful for loading, unloading, moving and aligning specimens, such as computer disks and semiconductor wafers. The degree of specimen handler movement accuracy depends on the precision and geometries of the mechanisms employed and on the degree of accuracy with which the movement is measured and controlled. Unfortunately, both patents describe only mechanism improvements, and do not address problems associated with measuring and controlling movement.

In another specimen handler example, U.S. Pat. No. 5,308,222 for NONCENTERING SPECIMEN PREALIGNER, which is assigned to the assignee of this application, describes a wafer prealigner and a wafer handler that cooperate to precisely position and orient semiconductor wafers for inspection, processing, and testing during the manufacture of integrated circuits. The wafer handling system has a wafer processing throughput that depends on the speed and accuracy with which predetermined features on individual wafers are presented to a processing station. It is nonproductive to waste time searching for particular features and/or position reference indicia. Therefore, article positioners, such as wafer handlers and prealigners, require not only precision mechanisms and very accurate movement measuring and controlling capability, but also a minimum of wasted motion.

In particular, the wafer handler of the above-described wafer handling system coordinates the rotation of a platform and the rotation of a pair of wafer holding paddles to achieve the desired movement for conveying wafers in straight line paths among a wafer storage cassette, the wafer prealigner and the processing station. Such coordinated motion requires accurate, high-resolution angular position data and, therefore, employs high-resolution incremental position encoders. In particular, the position encoders combine a compact three-bit gray coded encoder scale and a diffraction grating-based incremental encoder scale encircling an encoder disk to rapidly determine its angular positions to a resolution of 0.125 arc-second.

A disadvantage of a gray code is that its absolute angular position is known with certainty only at angles where the code changes states. For the above-described three-bit gray code, the code states change once every 45 degrees of rotation, and the incremental scale is employed to interpolate between the known angular positions. Because of possible power surges, system noise, irregular angular motions, direction reversals, and occasional encoder reading errors, it is desirable to periodically sense and confirm the absolute angular position of the encoder by rotating the encoder disk through at least one gray code state change to reestablish absolute positioning accuracy. Unfortunately, such rotational sensing causes an undesirable dead time that reduces wafer processing throughput.

Of course, gray code encoders having many more than three bits exist, but they are too bulky to fit inside the wafer prealigner or the wafer handler, are prohibitively complex and costly, and are subject to alignment problems.

What is needed, therefore, is a simple and compact position encoder that has a high encoder resolution requiring very little wasted motion to determine an absolute angular or linear position.

SUMMARY OF THE INVENTION

An object of the this invention is, therefore, to provide an improved position encoding apparatus and method.

Another object of this invention is to provide a virtual absolute position encoder suitable for use in specimen handling applications.

A further object of this invention is to provide a simple and compact absolute position encoder having very high encoding accuracy and resolution.

In a preferred embodiment of this invention, a semiconductor wafer handling system conveys, positions, and orients a wafer preparatory to processing by, for example, an automated test apparatus. The system includes a robotic wafer handler and a wafer prealigner that together employ multiple motor-driven platforms which cooperate to unload the wafers from a storage cassette, convey the wafers along precise linear paths, prealign the wafers for inspection and/or processing, and return the wafers to the storage cassette.

The rotary platforms are positionable in precise angular increments that are determined by the virtual absolute position encoder of this invention. The angular increments are determined to a 2,400 arc-second absolute resolution by a compact, single-track, continuously coded bar code scale and to a 0.125 arc-second relative resolution by interpolating interference patterns generated by a diffraction grating-based incremental encoder scale. The absolute and relative scales are each sensed by fixed-beam optical sensors. The position encoder of this invention may be considered a virtual absolute encoder because, although the rotary platforms move to operate the encoding apparatus to provide a measurement, as little as 0.66 degree of rotation is required to sense and confirm the absolute angular position of the rotary stage, thereby minimizing wasted motion.

The continuously coded bar code scale eliminates the need for stop bits and quiet zones, which results in increased bar code resolution. The preferred bar code format includes a continuously abutting series of 15-bar slot position bar code patterns positioned as a single track encircling an annular encoder disk. The first four bar slots of each pattern contain a fixed start code, and the remaining 11 bits contain a unique sector-identifying code, which does not match the start code. Accordingly, the sector-identifying codes do not ascend in a natural counting order, and a decoder, such as a read-only memory lookup table, is employed to associate each of the sector-identifying codes with an absolute angular position of the encoder disk.

Additional objects and advantages of this invention will be apparent from the following detailed description of a preferred embodiment thereof, which proceeds with reference to the accompanying drawings.

DETAILED DESCRIPTION OF PREFERRED EMBODIMENT

Figure 1:
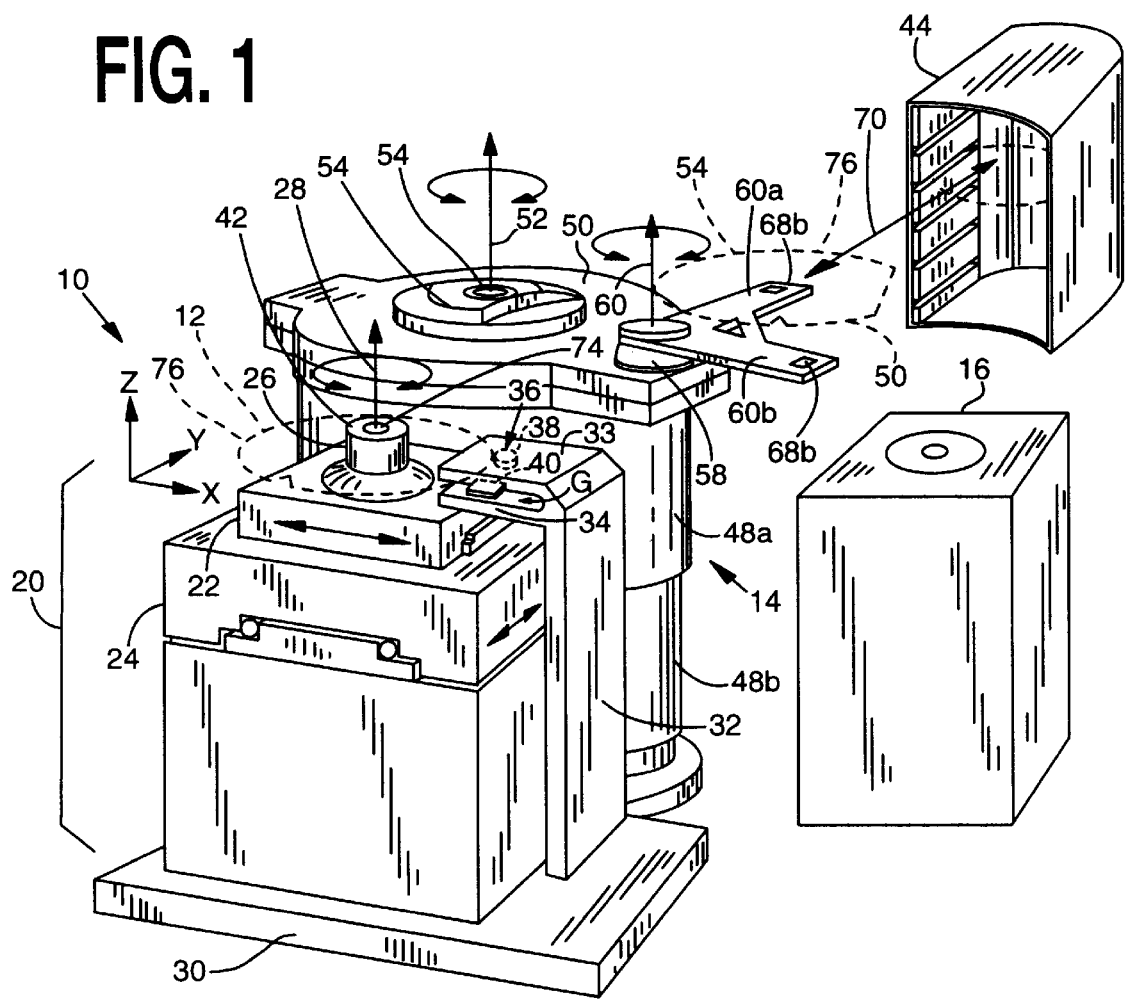
FIG. 1 is a diagrammatic isometric view of a specimen prealigner positioned adjacent to a robotic semiconductor wafer handler, either of which may employ a virtual absolute position encoder of this invention.

FIG. 1 shows a specimen handling system in which a specimen prealigner 10 selectively aligns a semiconductor wafer 12 into a predetermined position and orientation preparatory to transferring wafer 12 to a receiving station in an integrated circuit manufacturing facility.

In particular, prealigner 10 orients and positions wafer 12 for pickup by a robotic semiconductor wafer handler 14, which conveys wafer 12 and delivers it to a semiconductor test, inspection, or processing station 16. Prealigner 10 and wafer handler 14 require rapid and accurate coordinated positioning to ensure high wafer processing throughput and, therefore, both represent exemplary applications of a virtual absolute position encoder of this invention. The multiple rotary motions of wafer handler 14 are an ideal application for the virtual absolute position encoder of this invention. However, the invention is described with reference to prealigner 10 because of the wider variety of linear and rotary motions involved therein.

In particular, prealigner 10 accurately orients and positions wafer 12 such that wafer handler 14 can convey wafer 12 to processing station 16 in precise alignment with, for example, a microscope, test probes, or marking, or reading devices (not shown) employed by processing station 16. Prealigner 10 includes a motor-driven X-Y stage 20 having an X-axis substage 22 and a Y-axis substage 24 that provide translational motion in the X- and Y-axis directions, respectively. X-axis substage 22 carries a motor-driven rotary stage 26 that is adapted to releasibly hold wafer 12 and that provides rotational motion about a rotational axis 28 that is substantially parallel to a Z-axis direction. X-Y stage 20 and rotary stage 26 are capable of high-resolution motion that is repeatable at increments of 0.1 micrometer and 0.125 arc-second, respectively, and function together as a three-dimensional translational/rotational stage. A base 30 supports X-Y stage 20 and a scan assembly support arm 32 that has an upper arm 33 and a lower arm 34 protruding therefrom to form a gap G. An optical scanning assembly 36 (shown in phantom) includes a light source 38 mounted in upper arm 33 and a photodetector array 40 mounted in lower arm 34. Gap G is aligned with a top surface 42 of rotary stage 26 such that wafer 12 is held by rotary stage 26 and is positionable within gap G for sensing by scanning assembly 36.

Wafer handler 14 conveys wafer 12, for example, from a wafer storage cassette 44, to prealigner 10, and then to wafer processing station 16. More specifically, wafer 12 is stored in storage cassette 44 at an imprecise position and with a substantially arbitrary orientation. Prealigner 10 receives wafer 12 to precisely position and orient (i.e., align) it for subsequent delivery to processing station 16.

Wafer handler 14 includes a top cylinder 48a that is concentric with and overlaps a base cylinder 48b. Top cylinder 48a carries on its top side a specimen handling platform 50. Top cylinder 48a, together with platform 50, is rotatable about and movable along a central axis 52 that is substantially parallel to the Z-axis.

Platform 50 includes a nonrotatable central pedestal 54 that is axially aligned with and movable along central axis 52. A wafer handler paddle pedestal 58 positioned near the periphery of platform 50 supports a pair of wafer support paddles 60a and 60b that are rotatable on wafer handler paddle pedestal 58 about a paddle axis 62 that is substantially parallel to central axis 52.

A microprocessor-controlled drive mechanism (not shown) included within wafer handler 14 coordinates the rotation of platform 50 about central axis 52 and the rotation of paddles 60a and 60b about paddle axis 62 to achieve the desired movement for conveying wafer 12. Such coordinated motion requires accurate and high-resolution positioning data and is, therefore, a preferred application for the virtual absolute position encoder of this invention. In particular, determining the angular position of paddles 60a and 60b about paddle axis 62 requires a compact angular position encoder having a diameter of about 13 centimeters.

Wafer handler 14 acquires wafer 12 from storage cassette 44 by positioning paddle 60a beneath wafer 12. Platform 50 is then moved upward by raising top cylinder 48a along central axis 52 so that paddle 60a engages wafer 12. Vacuum pressure applied to a vacuum chuck 68a in paddle 60a secures wafer 12 to the paddle.

Wafer handler 14 moves wafer 12 along a straight-line path 70 from storage cassette 44. The microprocessor-controlled drive mechanism rotates platform 50 about central axis 52 and paddle 60a about paddle axis 62 to form the straight-line path 70. Straight-line path 70 can be achieved, for example, by rotating platform 50 in a clockwise direction while rotating paddle 60a in a counter-clockwise direction at precisely coordinated angular speeds.

After wafer 12 is removed from storage cassette 44 along straight-line path 70, platform 50 is rotated about central axis 52 to a prealigner position (not shown) from which wafer handler 14 moves wafer 12 along another straight-line path to rotary stage 26. Platform 50 is then moved downward by lowering top cylinder 48a along central axis 52 so that wafer 12 engages a vacuum chuck 74 located on top of rotary stage 26. Wafer 12 is transferred from paddle 60a to vacuum chuck 74 by the coordinated release of vacuum pressure to vacuum chuck 68a and application of vacuum pressure to vacuum chuck 74. X-axis substage 22 then moves in the X direction to engage wafer 12 in gap G for scanning by optical scanning assembly 36. All of the above-described angular and translational positionings represent application areas suitable for employing virtual absolute positions encoders of this invention.

Figure 2:
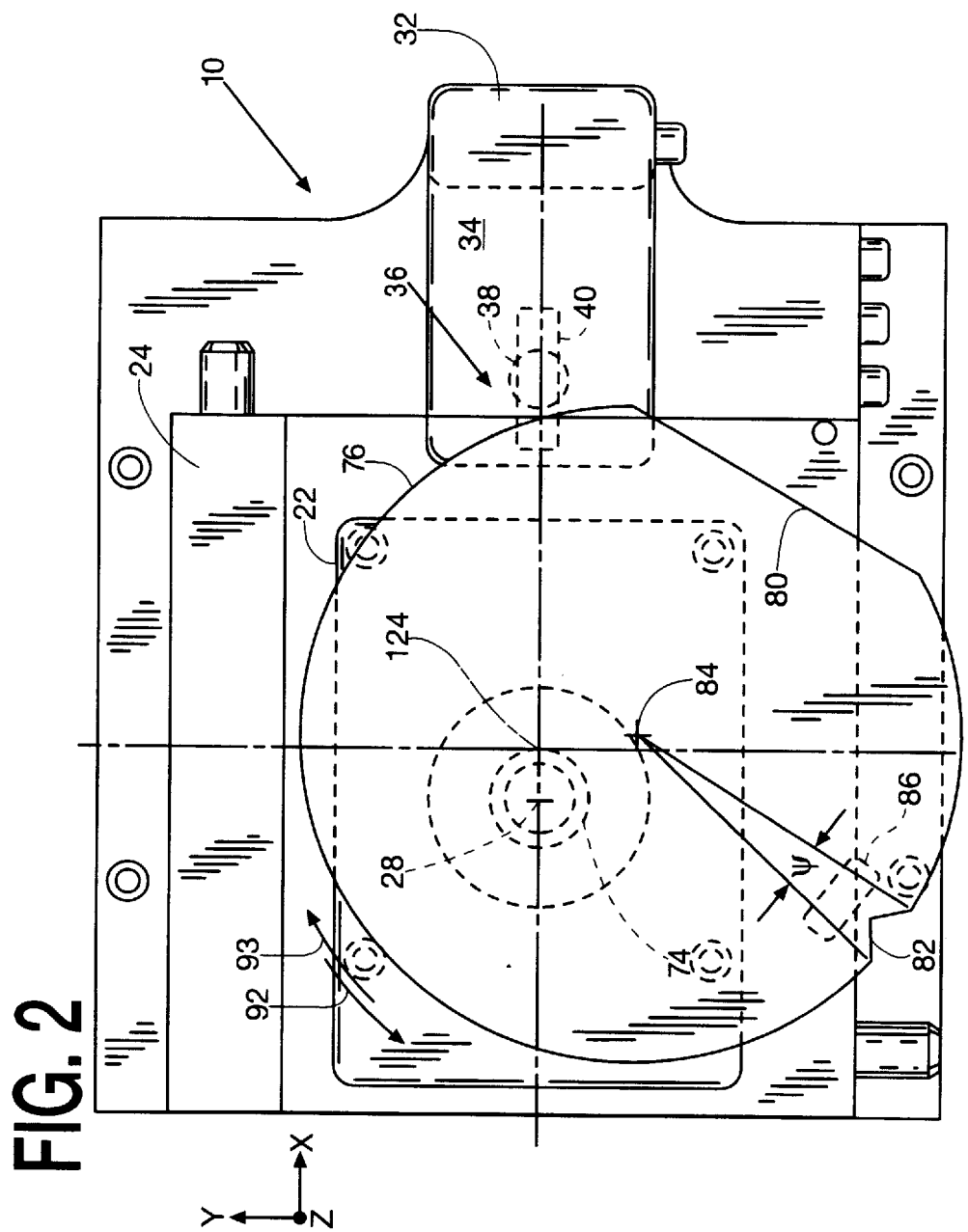
FIG. 2 is a plan view of a semiconductor wafer positioned to undergo an edge scan by the specimen prealigner of FIG. 1.

Referring to FIG. 2, one of the tasks prealigner 10 performs is an edge scan operation that acquires polar coordinate map data of a periphery 76 of wafer 12. The polar coordinate map data are manipulated in accordance with appropriate algorithms to compute the arbitrarily received position and orientation of wafer 12 in preparation for positioning wafer 12 in a preselected position and orientation for further processing. Periphery 76 of wafer 12 may have several edge features that may include a notch 82 and one or more flats 80 (only one shown) for identifying the orientation of wafer 12. Before flat 80 and notch 82 are formed in periphery 76, however, wafer 12 has a generally elliptical shape that is of slight eccentricity and is defined by intersecting major and minor axes (not shown). The position of wafer 12 is preferably determined, therefore, with respect to a wafer center 84 that is defined as the intersection of the major and minor axes.

Prealigner 10 performs the edge scan by rotating wafer 12 such that periphery 76 moves past optical scanning assembly 36. Upon completion of the edge scan, prealigner 10 computes the position and orientation of wafer 12 and optionally performs a second scan to read a wafer identifying bar code symbol 86 (outlined in phantom) positioned on the bottom major surface of wafer 12.

Figure 3:
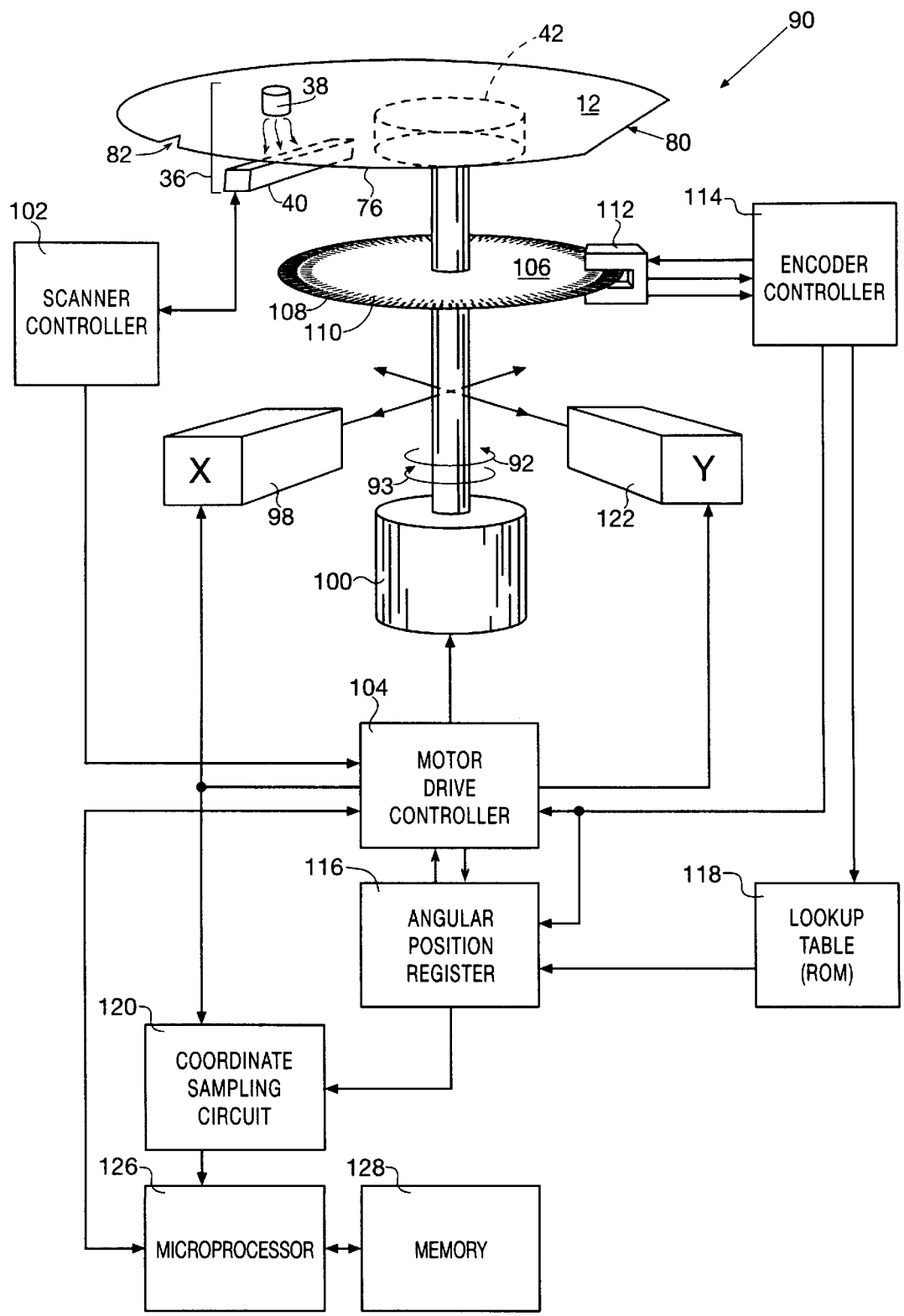
FIG. 3 is a simplified hybrid pictorial and functional block diagram of the prealigner of FIG. 1 showing a three-axis positioning system employing the virtual absolute position encoder of this invention.

FIG. 3 shows a three-axis positioning system 90 that cooperates with optical scanning assembly 36 to compute the position and orientation of wafer 12. During the edge scan of wafer 12 in either a counter-clockwise direction 92 or a clockwise direction 93, light source 38 and photodetector array 40 of optical scanning assembly 36 cooperate with an X-axis substage drive motor 98, a rotary stage drive motor 100, a scanner controller 102, and a motor drive controller 104 to form the polar coordinate map of periphery 76 of wafer 12.

More specifically, motor drive controller 104 delivers a rotation drive control signal to rotary stage drive motor 100, which responds by rotating wafer 12 on top surface 42 of rotary stage 26 at a preselected angular rate. A 13 centimeter diameter encoder disk 106 includes an incremental encoder scale 108 and a bar code scale 110 that are formed as radially adjacent annular tracks positioned near the periphery of the disk. A photo-optical detector 112 senses incremental encoder scale 108 and bar code scale 110 and provides respective relative and absolute encoding signals to an encoder controller 114.

Incremental encoder scale 108 employs a diffraction grating illuminated by an infrared laser diode (not shown) within photo-optical detector 112 to produce an amplitude modulated interference pattern that repeats at a precisely known length interval. The amplitude of the interference pattern is used to interpolate within the known length interval to generate relative encoding signals that provide 0.125 arc-second of relative encoding resolution for encoder disk 106. Likewise, bar code scale 110 employs a 15-bar slot bar code pattern illuminated by a light source (not shown) within photo-optical detector 112 to produce absolute encoding signals that provide a sector-identifying code for each 2,400 arc-seconds (approximately 0.66°) of rotation of encoder disk 106.

Skilled workers will recognize that this invention is not limited to using infrared detection of an encoder scale, but may also employ magnetic, mechanical, optical reflective, and optical transmissive techniques.

Encoder controller 114 conditions the relative encoding signals and conveys them to motor drive controller 104 and to an angular position register 116. Encoder controller 114 also conditions the absolute encoding signals and employs the conditioned relative encoding signals to sample the absolute encoding signals. The sampled absolute encoding signals are decoded to produce the sector-identifying code that is received by a lookup table 118, such as a read-only memory, for conversion to a corresponding angular reference datum. A unique angular reference datum is generated for each of 2,400 arc-seconds of rotation of encoder disk 106, with a total of 540 angular reference data generated per revolution. Each angular reference datum is conveyed to angular position register 116.

Angular position register 116 is preset by each received angular reference datum and incremented by each received relative encoding signal. Therefore, as encoder disk 106 rotates, angular position register 116 is incremented for each arc-second of rotation and updated to an absolute angular reference datum once for each of 2,400 arc-seconds of rotation. Under normal operating conditions, i.e., no power surges, nominal system noise, regular angular motion, and no encoder reading errors between successive angular reference data, angular position register 116 continuously stores a numerical value, in a range of from zero to 1,295,999 arc-seconds, indicative of the absolute angular position of encoder disk 106. However, if an abnormal operating condition occurs, rotating encoder disk 106 by at least 2,400 arc-seconds, but at most about 4,800 arc-seconds, will preset angular position register 116 to the correct value.

Of course, angular position register 116 is also set to the correct value during normal operating conditions such as, for example, power up initialization, incremental encoder verification testing, and failure recovery testing processes.

Motor drive controller 104 and angular position register 116 cooperate to deliver angle sampling pulses to a coordinate sampling circuit 120. The angle sampling pulses may correspond to the 0.125 arc-second increments of the angular orientation of wafer 12 relative to optical scanning assembly 36 or may be timed to correspond to other predetermined angular increments.

Motor drive controller 104 delivers a Y-axis control signal to Y-axis substage drive motor 122 to align Y-axis substage 24 (FIG. 2) with a stage-center axis 124. In addition, scanner controller 102 delivers an alignment feedback signal to motor drive controller 104, which responds by delivering an X-axis control signal to X-axis substage drive motor 98 such that the X-axis control signal functions to maintain periphery 76 of wafer 12 in alignment with the center of photodetector array 40. The magnitude of the X-axis control signal corresponds to the radial position of periphery 76 and is, therefore, supplied to a second input of coordinate sampling circuit 120. Coordinate sampling circuit 120 samples the radial position in response to the angle sampling pulses such that coordinate sampling circuit generates a radial position value of periphery 76 for each 0.125 arc-second of rotation of wafer 12.

A microprocessor 126 receives the radial position values and generates polar coordinate map data including θ and r values for periphery 76 relative to rotational axis 28 (FIG. 2).

Coordinate sampling circuit 120 also causes microprocessor 126 to transfer the polar coordinate data to a data storage means, such as a memory 128. After a complete 360° edge scan of periphery 76, memory 128 contains a polar coordinate map representing periphery 76 of wafer 12. Microprocessor 126 employs the polar coordinate map to determine the position of wafer center 84 relative to rotational axis 28 and the angular locations of flat 80 and notch 82 on wafer periphery 76. Microprocessor 126 then cooperates with motor drive controller 104 to generate control signals that align wafer 12 for subsequent processing by processing station 16.

In an alternative two-axis embodiment, Y-axis substage 24 can be eliminated if X-axis substage 22 is positioned to align rotational axis 28 of rotary stage 26 with stage-center axis 124 (FIG. 2). X-axis substage 22 then provides radial translation of wafer 12 to maintain periphery 76 in approximate alignment with the center of photodetector array 40. In the two axis embodiment, Y-axis positioning is typically provided by a secondary specimen handler, such as wafer handler 14 or a robot arm wafer handler.

An encoding format of this invention for bar code scale 110 conforms to the following general guidelines:

N=the total number of bar slots in each bar code (a bar code includes a start code and a sector-identifying code);

A bar occupying a bar slot indicates a predetermined logic state;

M=the number of adjacent logic-1 states that form a start code (at least one logic-0 state must immediately follow the start code);

N-M=the number of remaining bar slots available to form a sector-identifying code; and M-1=the maximum number of adjacent logic-1 states in any sector-identifying code.

Figure 4:
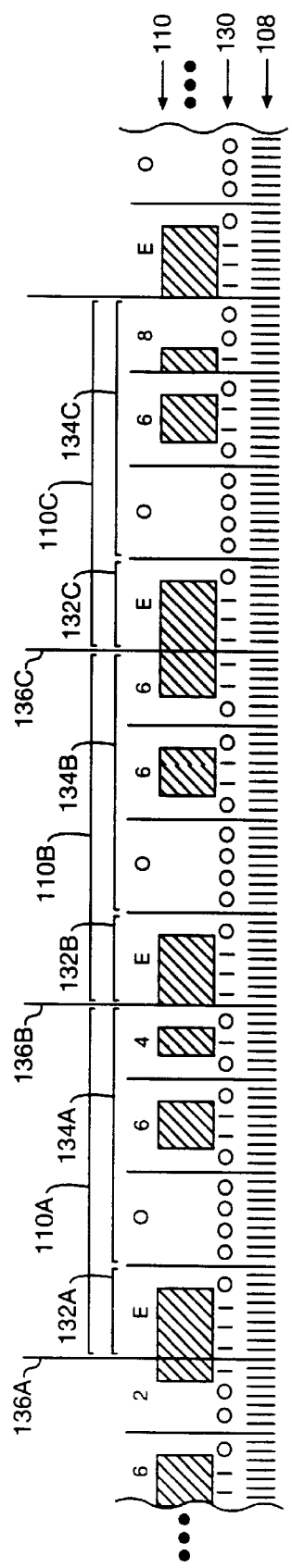
FIG. 4 is a pictorial schematic diagram depicting a virtual absolute position encoding format of this invention.

In accordance with the guidelines, a preferred encoding format for bar code scale 110 is illustrated in FIG. 4, which shows three adjacent sector-identifying bar codes 110A, 10B and 110C; corresponding bar code data 130; and an associated portion of incremental encoder scale 108. In the preferred encoding format, each bar slot has a constant width, a bar occupying a slot indicates a logic-1 state, N=15, M=3, sector-identifying codes may occupy 12 bar slots, and a maximum of two adjacent bars may be occupied in any sector-identifying code.

The first of those remaining 12 slots is the logic-0 state following the start code; therefore, this dedicated slot reduces to 11 the effective number of bar slots available for sector-identifying codes. However, because no more than two adjacent bar slots may be occupied, and because bar code scale 110 requires a high packing density, an imaginary logic-0 state is appended to the sector-identifying code to restore the effective number of bar slots to 12. Therefore, each sector-identifying code has an effective length of 12 bits composed of a physical length of 11 bits with an implied trailing logic-0 state.

The preferred encoding format is described, by way of example, with reference to sector-identifying bar codes 110A, 110B, and 110C, which each include three adjacent start code bars followed by an empty bar slot to form respective start codes 132A, 132B, and 132C (collectively "start codes 132"). Start codes 132 are followed by respective 11-bit sector-identifying codes 134A, 134B, and 134C, which each have an implicit trailing logic-0 state. Therefore, sector-identifying codes 134A, 134B, and 134C have respective logic state patterns 00000110010(0), 00000110011(0), and 00000110100(0) that have corresponding hexadecimal values 064, 066, and 068. Sector-identifying codes 134 are employed to address locations in lookup table 118 (FIG. 3) that return respective absolute angle values of 93,600, 96,000, and 98,400 arc-seconds of rotation, each corresponding to a respective angular reference datum 136A, 136B, and 136C (collectively "angular reference data 136").

In the preferred encoding format, angular reference data 136 correspond positionally to a coincidence point shared by a starting point of the first bar slot in each of start codes 132 and a nearest arc-second position of incremental encoder scale 108. Of course, angular reference data 136 may correspond to other absolute angular positions identifiable by bar code scale 110.

The preferred guideline that a maximum of two adjacent bars be occupied in any sector-identifying code does not mean that three or more bars may not be adjacently positioned. For example, five adjacent bars occupy bar slots in a zone spanning sector-identifying code 134B and start code 132C. The two-adjacent-bar restriction applies only within a sector-identifying code 134. Start codes 132 are, therefore, preferably identifiable by the logical 1110 (hexadecimal E) pattern.

Decoding of bar code scale 110 by encoder controller 114 (FIG. 3) is carried out conventionally by, for example, a shift register that serially receives the absolute encoding signals and presents a parallel representation thereof to decoding logic. Start codes 132 are recognized, for example, by sensing a logic 1110 pattern in the left- or right-most four bits of the shift register, which further indicates that the adjacent 11 bits of the shift register contain the associated sector-identifying code.

Table 1 shows a representative portion of the preferred bar code patterns, their corresponding hexadecimal values, and decoded angular reference values (in arc-seconds) from which skilled workers can readily deduce the complete set of patterns and values. The particular patterns shown in FIG. 4 are highlighted in bold text.

TABLE 1

| ARCSECS | PATTERN | HEX VALUE |
|---|---|---|
| 0 | 111000000000000 | E000 |
| 2400 | 111000000000001 | E002 |
| 4800 | 111000000000010 | E004 |
| 7200 | 111000000000011 | E006 |
| 9600 | 111000000000100 | E008 |
| 12000 | 111000000000101 | E00A |
| 14400 | 111000000000110 | E00C |
| 16800 | 111000000001000 | E010 |
| 19200 | 111000000001001 | E012 |
| 21600 | 111000000001010 | E014 |
| 24000 | 111000000001011 | E016 |
| 26400 | 111000000001100 | E018 |
| 28800 | 111000000001101 | E01A |
| 31200 | 111000000010000 | E020 |
| 33600 | 111000000010001 | E022 |
| 36000 | 111000000010010 | E024 |
| 38400 | 111000000010011 | E026 |
| 40800 | 111000000010100 | E028 |
| 43200 | 111000000010101 | E02A |
| 45600 | 111000000010110 | E02C |
| 48000 | 111000000011000 | E030 |
| 50400 | 111000000011001 | E032 |
| 52800 | 111000000011010 | E034 |
| 55200 | 111000000011011 | E036 |
| 57600 | 111000000100000 | E040 |
| 60000 | 111000000100001 | E042 |
| 62400 | 111000000100010 | E044 |
| 64800 | 111000000100011 | E046 |
| 67200 | 111000000100100 | E048 |
| 69600 | 111000000100101 | E04A |
| 72000 | 111000000100110 | E04C |
| 74400 | 111000000101000 | E050 |
| 76800 | 111000000101001 | E052 |
| 79200 | 111000000101010 | E054 |
| 81600 | 111000000101011 | E056 |
| 84000 | 111000000101100 | E058 |
| 86400 | 111000000101101 | E05A |
| 88800 | 111000000110000 | E060 |
| 91200 | 111000000110001 | E062 |
| 93600 | 111000000110010 | E064 |
| 96000 | 111000000110011 | E066 |
| 98400 | 111000000110100 | E068 |
| 100800 | 111000000110101 | E06A |
| 1284000 | 111010000101000 | E850 |
| 1286400 | 111010000101001 | E852 |
| 1288800 | 111010000101010 | E854 |
| 1291200 | 111010000101011 | E856 |
| 1293600 | 111010000101100 | E858 |

Figure 5:
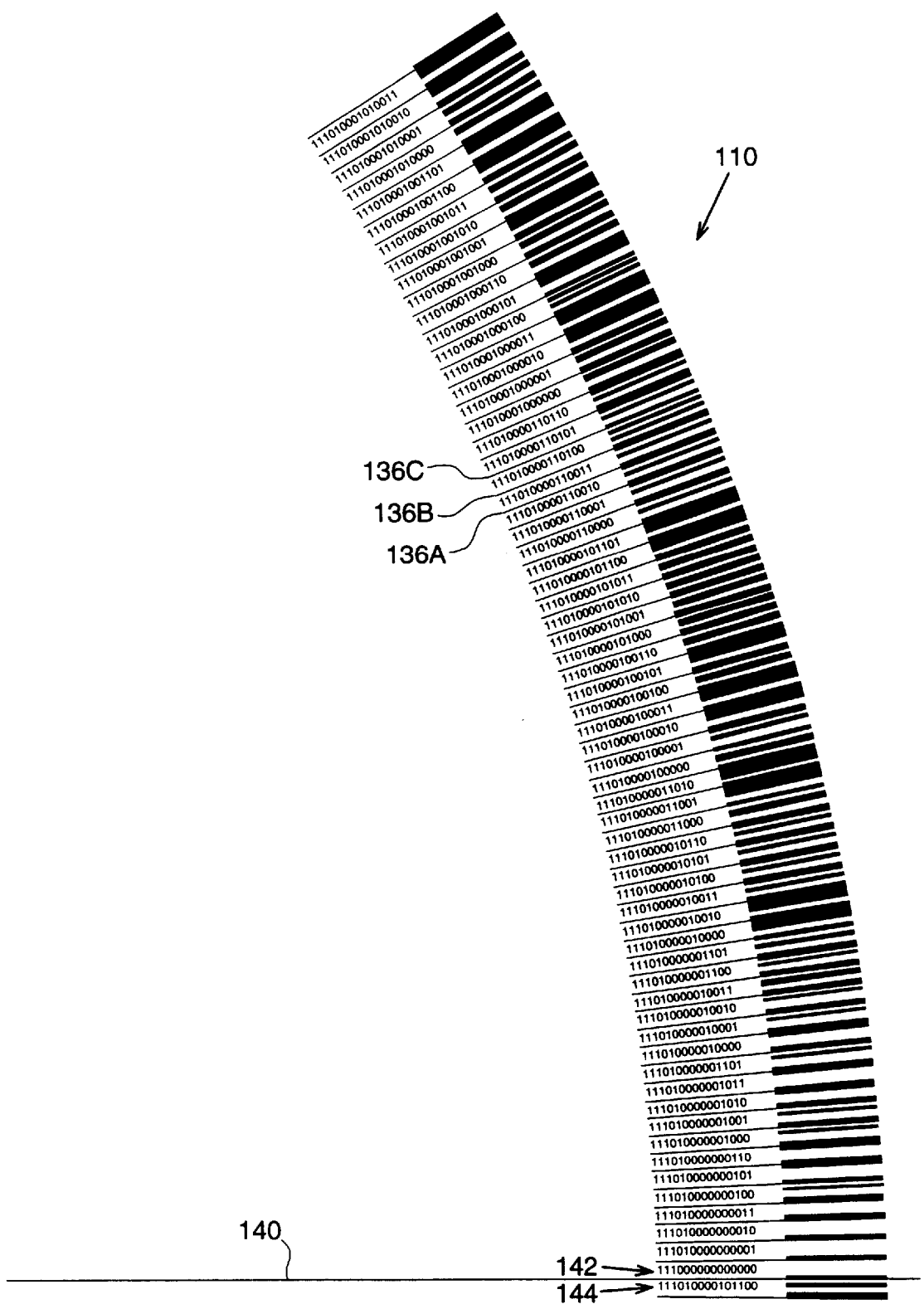
FIG. 5 is an enlarged fragmentary plan view of a 45-degree portion of a sector-identifying bar code scale of this invention.

FIG. 5 is an enlarged view of a 45-degree portion of bar code scale 110 of this invention that includes angular reference data 136. Skilled workers will understand that the bar code legends and angular reference data are shown for illustrative purposes only and preferably do not exist on actual encoder disks. Bearing that in mind, bar code scale 110 further includes a zero-degree reference line 140 that delineates the transition between a first sector-identifying bar code 142 and a last sector-identifying bar code 144 on bar code scale 110. Sector-identifying bar codes 142 and 144 correspond respectively to the first and last entries listed above in Table 1.

Skilled workers will recognize that portions of this invention may be implemented differently from the implementations described above for a preferred embodiment. For example, the virtual absolute encoder of this invention may be employed in linear as well as angular encoder applications and may be adapted to suit a wide variety of encoding accuracies and resolutions. Likewise, a wide variety of logic state coding combinations may be employed together with many different bar code encoding techniques, such as multi-width bar encoding, and sensing techniques, such as scanning beam readers. Moreover, the absolute sector-identifying bar code scale may be used without an incremental encoder scale in some applications, and the incremental encoder employed is not limited to the diffraction grating-based interpolation technique. And, of course, the bar code decoder may employ techniques other than a lookup table, such as a counter or a processor programmed to skip the same predetermined values that are skipped by the sector-identifying codes.

It will be obvious to those having skill in the art that many changes may be made to the details of the above-described embodiment of this invention without departing from the underlying principles thereof. Accordingly, it will be appreciated that this invention is also applicable to position encoding applications other than those found in semiconductor wafer handlers. The scope of the present invention should, therefore, be determined only by the following claims.

We claim:

1. An encoding apparatus for determining an absolute position of a movable member relative to a stationary member, comprising:

an absolute encoder scale supported by a first one of the members, the absolute encoder scale including a continuous series of abutting N-bit bar code symbols, each bar code symbol including an M-bit start code that is the same for every bar code symbol and a N-M bit sector-identifying code that does not include the start code and is unique from every other sector-identifying code, and each sector-identifying code identifying an absolute reference datum position along the absolute encoder scale;

a relative encoder scale supported by the first one of the members, the relative encoder scale including a diffraction grating illuminated by a monochromatic light source to produce an interference pattern having amplitude maxima and amplitude minima that identify relative positions along the relative encoder scale;

a detector supported by a second one of the members sensing the bar code symbols and the interference pattern and generating respective absolute and relative encoding signals;

memory storage locations that store the absolute reference data positions of the absolute encoder scale; and a decoder operatively associated with the memory storage locations to retrieve the stored absolute reference data positions corresponding to the sector-identifying codes in response to the absolute encoding signal to determine the absolute reference data positions along the absolute encoder scales, and the decoder responsive to the relative encoding signal for interpolating the relative positions between the amplitude maxima and amplitude minima to determine the absolute position of the movable member relative to the stationary member and to periodically sense and confirm the absolute position in response to the decoded absolute reference data positions.

2. The apparatus of claim 1 in which the detector is a photo-optical fixed-beam type.

3. The apparatus of claim 1 in which the absolute and relative encoding scales are flat and annular and are supported by an encoder disk that constitutes the movable member.

4. The apparatus of claim 3 in which the absolute reference data positions are spaced along the absolute encoder scale by an angle of about 2,400 arc-seconds.

5. The apparatus of claim 1 in which N=15.

6. The apparatus of claim 1 in which M=3.

7. The apparatus of claim 1 in which the sector-identifying codes are physically 11 bits long and have appended to them an imaginary logic-0 bit that makes the sector-identifying codes effectively 12 bits long.

8. The apparatus of claim 1 in which the sector-identifying codes include no more than M-1 adjacent logic-1 bits.

9. In an encoding apparatus for determining an absolute position of a movable member relative to a stationary member, the encoding apparatus including an absolute encoder scale and a relative encoder scale both of which supported by one of the movable and stationary members, a detector supported by the other one of the movable and stationary members and producing detector output signals in response to encoded information on the absolute and relative encoder scales, and a decoder responsive to the detector output signals to determine the absolute position of the movable member relative to the stationary member, a method of providing a virtual absolute position encoder having high encoding accuracy and resolution, comprising:

encoding the absolute encoder scale with a bar code scale in a bar code format that includes a continuous series of abutting bar code patterns each having a set of multiple bar slot positions divided into first and second subsets, the first subset including a first number of bar code slots defining a common start code pattern for all of the bar code patterns included in the series and the second subset including a second number of bar code slots defining for each of the bar code patterns a sector-identifying code that is different from the sector-identifying codes of all others of the bar code patterns and that does not include the start code pattern in any group of first number of bar code slots; and providing, in operative association with the decoder, memory storage locations that store absolute angular positions of the absolute encoder scale, each of the absolute angular positions corresponding to a unique one of the sector-identifying codes for a conversion to a corresponding reference datum for use in decoding angular position information from the relative encoder scale.

10. The method of claim 9 in which the movable member comprises an encoder disk and the absolute encoder and relative encoder scales comprise concentric tracks on the encoder disk.

11. The method of claim 10 in which the encoder disk has a circumference and the absolute encoder and relative encoder scales comprise concentric tracks that encircle entirely the circumference of the encoder disk.

12. The method of claim 10, further comprising providing interpolation circuitry responsive to each reference datum to decode the angular position information from the relative encoder scale and thereby provide a signal indicative of the absolute position of the movable member.

13. The method of claim 12 in which the relative encoder scale comprises a diffraction grating, and further comprising directing light from a source of monochromatic light to illuminate the diffraction grating and thereby produce an interference pattern from which relative angular positions along the relative encoder scale can be derived.

14. The method of claim 10, further comprising a look-up table in which the memory storage locations reside.

* * * * *

UNITED STATES PATENT AND TRADEMARK OFFICE
CERTIFICATE OF CORRECTION

PATENT NO. : 5,852,413

DATED : December 22, 1998

INVENTOR(S) : PAUL BACCHI and PAUL S. FILIPSKI

It is certified that error appears in the above-indentified patent and that said Letters Patent is hereby corrected as shown below:

Column 7, line 67, change "10B" to --110B--.

Column 9, lines 37-40, change

| "93600 | 111000000110010 | E064 |
| 96000 | 111000000110011 | E066 |
| 98400 | 111000000110100 | E068 |
| 100800 | 111000000110101 | E06A |
| 1284000 | 111010000101000 | E850", to |

| --93600 | 111000000110010 | E064 |
| 96000 | 111000000110011 | E066 |
| 98400 | 111000000110100 | E068 |
| 100800 | 111000000110101 | E06A |
| \| | \| | \| |
| 1284000 | 111010000101000 | E850--. |

UNITED STATES PATENT AND TRADEMARK OFFICE
CERTIFICATE OF CORRECTION

PATENT NO. : 5,852,413

DATED : December 22, 1998

INVENTOR(S) : PAUL BACCHI and PAUL S. FILIPSKI

It is certified that error appears in the above-identified patent and that said Letters Patent is hereby corrected as shown below:

Column 10, line 50, claim 1, change "scales" to --scale--.

Signed and Sealed this

Seventh Day of September, 1999

Attest:

Q. TODD DICKINSON

Attesting Officer

Acting Commissioner of Patents and Trademarks